(12) United States Patent
Tandon et al.

(10) Patent No.: US 7,016,392 B2
(45) Date of Patent: Mar. 21, 2006

(54) GAAS-BASED LONG-WAVELENGTH LASER INCORPORATING TUNNEL JUNCTION STRUCTURE

(76) Inventors: Ashish Tandon, 3500 Deer Creek Rd., M/S 26M-10, Palo Alto, CA (US) 94304; Michael H. Leary, 3500 Deer Creek Rd., M/S 26M-10, Palo Alto, CA (US) 94304; Ying-Lan Chang, 3500 Deer Creek Rd., M/S 26M-10, Palo Alto, CA (US) 94304

( * ) Notice: Subject to any disclaimer, the term of this patent is extended or adjusted under 35 U.S.C. 154(b) by 0 days.

(21) Appl. No.: 10/427,585

(22) Filed: Apr. 30, 2003

(65) Prior Publication Data
US 2004/0218655 A1   Nov. 4, 2004

(51) Int. Cl.
*H01S 3/08* (2006.01)
(52) U.S. Cl. .......................... 372/96; 372/92; 372/99; 372/43.01; 372/46.011; 372/50.124
(58) Field of Classification Search ............... 372/96, 372/92, 99, 43–50, 98
See application file for complete search history.

(56) References Cited

U.S. PATENT DOCUMENTS

| | | | | |
|---|---|---|---|---|
| 4,230,997 A | * | 10/1980 | Hartman et al. ............ 372/45 |
| H000667 H | * | 9/1989 | Bedair et al. .............. 136/249 |
| 5,166,761 A | * | 11/1992 | Olson et al. ............... 257/46 |
| 5,944,913 A | * | 8/1999 | Hou et al. ................. 136/255 |
| 6,542,531 B1 | * | 4/2003 | Sirbu et al. ................ 372/46 |
| 6,765,238 B1 | * | 7/2004 | Chang et al. ............... 257/104 |
| 6,771,680 B1 | * | 8/2004 | Bour et al. ................. 372/43 |
| 6,810,064 B1 | * | 10/2004 | Coldren et al. ............. 372/96 |
| 6,931,042 B1 | * | 8/2005 | Choquette et al. ........... 372/103 |
| 2004/0076209 A1 | * | 4/2004 | Bour et al. ................ 372/45 |
| 2004/0206389 A1 | * | 10/2004 | Takamoto et al. ........... 136/255 |
| 2004/0217343 A1 | * | 11/2004 | Chang et al. .............. 257/25 |
| 2005/0083979 A1 | * | 4/2005 | Leary et al. ............... 372/43 |

* cited by examiner

*Primary Examiner*—Minsun Oh Harvey
*Assistant Examiner*—Delma R. Flores-Ruiz

(57) ABSTRACT

The light-emitting device comprises a substrate, an active region and a tunnel junction structure. The substrate comprises gallium arsenide. The active region comprises an n-type spacing layer and a p-type spacing layer. The tunnel junction structure comprises a p-type tunnel junction layer adjacent the p-type spacing layer, an n-type tunnel junction layer and a tunnel junction between the p-type tunnel junction layer and the n-type tunnel junction layer. The p-type tunnel junction layer comprises a layer of a p-type first semiconductor material that includes gallium and arsenic. The n-type tunnel junction layer comprises a layer of an n-type second semiconductor material that includes indium, gallium and phosphorus. The high dopant concentration attainable in the second semiconductor material reduces the width of the depletion region at the tunnel junction and increases the electrostatic field across the tunnel junction, so that the reverse bias at which tunneling occurs is reduced.

14 Claims, 5 Drawing Sheets

GAAS-BASED LONG-WAVELENGTH LASER INCORPORATING TUNNEL JUNCTION STRUCTURE

BACKGROUND OF THE INVENTION

Light-emitting devices are used in many applications including optical communication systems. Use of optical communication systems continues to increase due to the large signal bandwidth such systems provide. Many optical communication systems operate at relatively long wavelengths, in the range from about 1.2 micrometers ($\mu$m) to about 1.6 $\mu$m, because optical fibers typically have their lowest attenuation in this wavelength range. Long-wavelength optical communication systems require light sources that emit light at such relatively-long wavelengths. Many optical communication systems use a vertical-cavity surface-emitting laser (VCSEL) as the light source, although other types of light sources are also available.

VCSELs are typically characterized by an optical cavity defined by a pair of mirrors, generally referred to as distributed Bragg reflectors (DBRs), disposed parallel to the major surface of a substrate. The optical cavity generally includes an active region composed of a quantum well structure sandwiched between a pair of spacing layers. The quantum well structure defines one or more quantum wells and is composed of N quantum well layers interleaved with N+1 barrier layers, where N$\geq$1. Each quantum well layer sandwiched between two barrier layers defines a respective quantum well. Typically, no dopants are added to the semiconductor materials of the quantum well structure.

One of the spacing layers is a layer of n-type semiconductor material and the other of the spacing layers is a layer p-type semiconductor material. The n-type and p-type spacing layers inject electrons and holes, respectively, into the quantum well structure and additionally define the distance between the DBRs so that the optical cavity has a thickness equal to an integral multiple of the desired emission wavelength in the materials of the active region.

The DBRs are fabricated of alternating layers of materials that have different refractive indices. The number of layer pairs and the refractive index difference between the materials of the layers constituting the layer pairs collectively define the reflectivity of the DBR. The reflectivity is wavelength dependent and has a peak at the desired emission wavelength. The wavelength at which the reflectivity has a maximum is determined by the thickness of the layers constituting the layer pairs and refractive indices of the materials of the layers. One of the DBRs has fewer layer pairs than the other and is therefore slightly less reflective. The light generated by the VCSEL is emitted through the less-reflective of the DBRs.

Gallium arsenide (GaAs) is by far the most commonly-used substrate material for making VCSELs. Compared to alternatives such as indium phosphide (InP), GaAs wafers are substantially lower in cost, are commercially available in larger diameters and are commercially available with more different orientations of their crystalline surfaces. Also, pairs of semiconductor materials exist that can be epitaxially grown on GaAs with good crystal quality and that have a relatively large difference in their refractive indices. An example of such a pair of materials is GaAs and AlGaAs. DBRs made of such semiconductor materials grown on GaAs require fewer layer pairs to obtain a given reflectivity than DBRs made of semiconductor materials that can be grown on other substrate materials.

In operation, carriers, i.e., electrons and holes, injected into the quantum well structure by the adjacent spacing layers are trapped in the quantum wells, where they recombine to generate light at the desired emission wavelength. The materials of the layers of the quantum well structure are chosen to provide emission at the desired wavelength.

Many conventional types of VCSEL employ semiconductor DBRs in which semiconductor materials are used as the materials of the layer pairs. In an example of such VCSELs, a substrate-side DBR is located on the substrate, the n-type spacing layer, the quantum well structure and the p-type spacing layer are located, in order, on the substrate-side DBR and a remote-side DBR is located on the p-type spacing layer. In such DBRs, current typically passes from an electrode located on the top of the remote-side DBR to an electrode located on the bottom of the substrate. The DBRs are doped to have the same conductivity type as the adjacent spacing layer to make them electrically conductive, i.e., the substrate-side DBR is doped n-type and the remote-side DBR is doped p-type.

Conventional VCSELs have problems with high optical losses and excess Joule heating in their p-type DBRs. These problems can be overcome by incorporating a tunnel junction in the optical cavity, which allows both DBRs to be doped n-type. A VCSEL having two n-type DBRs has lower optical losses and a higher electrical conductivity than one having one n-type DBR and one p-type DBR. A significant benefit of the reduced optical losses is a lower threshold gain and a correspondingly higher differential gain. Differential gain is a key parameter for achieving high-bandwidth modulation in semiconductor lasers, especially in VCSELs.

FIG. 1 shows a side view of an example of a semiconductor device 10 incorporating a tunnel junction structure 12 that defines a tunnel junction. Semiconductor device 10 may be part of a VCSEL, for example. The tunnel junction structure is composed of an n-type tunnel junction layer 14, a p-type tunnel junction layer 16 and a tunnel junction 20 between the tunnel junction layers. The n-type tunnel junction layer is a layer of n-type semiconductor material. The p-type tunnel junction layer is a layer of p-type semiconductor material.

Semiconductor device 10 additionally includes n-type layer 22 on which n-type tunnel junction layer 14 is grown and p-type layer 24 grown on p-type tunnel junction layer 16. N-type layer 22 may constitute the substrate of semiconductor device 10. Alternatively, n-type layer 22 may be grown on or over the substrate.

Applying a reverse bias across tunnel junction 20 causes a tunneling current to flow across the tunnel junction. A reverse bias is applied by setting n-type tunnel junction layer 14 to a more positive voltage than p-type tunnel junction layer 16. The reverse conduction characteristic of tunnel junction 20 has a threshold characteristic, i.e., a voltage greater than a threshold voltage has to be applied across the tunnel junction before a significant tunneling current will flow. It is desirable to minimize the voltage drop across tunnel junction 20 to reduce the overall voltage drop across semiconductor device 10 and to reduce power dissipation in the tunnel junction.

The voltage drop across tunnel junction 20 can be reduced by forming tunnel junction structure 12 of semiconductor materials that establish a large built-in electrostatic field across the tunnel junction. A large electrostatic field requires a large potential difference across a short distance. Conventional approaches to minimizing the voltage drop across the tunnel junction have focused on minimizing the width of the depletion region at the tunnel junction by maximizing the doping concentrations in the semiconductor materials of tunnel junction layers 14 and 16.

FIGS. 2A and 2B each include a schematic energy diagram 40 and an electrical circuit model 42 that show some of the characteristics of tunnel junction structure 12. FIG. 2A shows the characteristics of the tunnel junction structure with no bias applied. FIG. 2B shows the characteristics of the tunnel junction structure under reverse bias. Each energy diagram shows the conduction band energy $E_{CN}$ and the valence band energy $E_{VN}$ of the semiconductor material of n-type tunnel junction layer 14 and additionally show and the valence band energy $E_{VP}$ of the semiconductor material of p-type tunnel junction layer 16. N-type tunnel junction layer 14 and p-type tunnel junction layer 16 collectively form tunnel junction 20. Each energy diagram also shows the Fermi level $E_{FN}$ of the semiconductor material of n-type tunnel junction layer 14 and the Fermi level $E_{FP}$ of the semiconductor material of p-type tunnel junction layer 16.

The energy diagram of FIG. 2A shows the depletion region 44 that exists at tunnel junction 20 with no bias applied. With no bias applied, the Fermi level $E_{FN}$ of the semiconductor material of n-type tunnel junction layer is equal to the Fermi level $E_{FN}$ of the semiconductor material of p-type tunnel junction layer 16. The conduction bands of the materials of the tunnel junction layers differ in energy, which establishes the built-in potential barrier 46 at the tunnel junction that prevents conduction through the tunnel junction at low forward bias. The electrostatic field strength at the tunnel junction depends on the height of the built-in potential barrier and depends inversely on the width W of depletion region 44.

A forward bias applied across tunnel junction 20 decreases the height of the built-in potential barrier at the tunnel junction. Sufficient forward bias causes current to flow across the tunnel junction in the forward direction. A forward bias is established by setting p-type tunnel junction layer 16 to a more positive voltage than n-type tunnel junction layer 14. The width of depletion region 44 decreases under forward bias (not shown).

A reverse bias applied across tunnel junction 20 as shown in FIG. 2B adds to the height of the built-in potential barrier and increases the width of depletion region 44 to W'. The reverse bias separates the Fermi levels $E_{FN}$ and $E_{FP}$ on opposite sides of the tunnel junction. In the example shown, the Fermi level $E_{FP}$ of the material of p-type tunnel junction layer 16 has increased relative to its no-bias level, whereas the Fermi level $E_{FN}$ of the material of n-type tunnel junction layer 14 remains substantially unchanged. In a conventional p-n junction, the large width of the depletion region allows only a small leakage current to flow across the junction under reverse bias. However, in tunnel junction 20, the reverse bias applied across the narrow depletion region causes electrons tunnel through the potential barrier from the valance band of p-type tunnel junction layer 16 to the conduction band of n-type tunnel junction layer.

The reverse bias elevates the valence band energy $E_{VP}$ of the semiconductor material of p-type tunnel junction layer 16 to a level above the conduction band energy $E_{CN}$ of the semiconductor material of n-type tunnel junction layer 14. This allows electrons in the valence band of the semiconductor material of the p-type tunnel junction layer to tunnel through the potential barrier to unoccupied sites in the conduction band of the semiconductor material of n-type tunnel junction layer 14, as shown schematically in FIG. 2B. The greater the reverse bias applied across tunnel junction 20, the higher the probability that an electron, e⁻, will tunnel across tunnel junction 20, and the higher the conduction across the tunnel junction.

In conventional tunnel junction structure 12, the semiconductor materials of tunnel junction layers 14 and 16 have a relatively large band-gap energy difference. Such materials establish a relatively high tunneling barrier at tunnel junction 20. A large reverse bias therefore has to be applied across the tunnel junction structure to cause a tunneling current of the order of the laser current of a laser diode to flow. Such tunnel junction structures therefore typically have a high voltage drop, which is usually undesirable. As noted above, the voltage drop across the tunnel junction is conventionally reduced by doping the tunnel junction layers at as high a dopant concentration as possible. This reduces the width of the depletion region and thereby increases the tunneling probability. If even one of the tunnel junction layers is not doped to a doping concentration that provides degeneracy, an additional reverse bias equal to the voltage difference between the Fermi level and the band edge must be applied before any tunneling commences.

Thus, what is needed is a tunnel junction structure for use in GaAs-based lasers that will have a lower voltage drop than conventional GaAs-based tunnel junction structures.

SUMMARY OF THE INVENTION

In one aspect, the invention provides a light-emitting device that comprises a substrate, an active region and a tunnel junction structure. The substrate comprises gallium arsenide. The active region comprises an n-type spacing layer and a p-type spacing layer. The tunnel junction structure comprises a p-type tunnel junction layer adjacent the p-type spacing layer, an n-type tunnel junction layer and a tunnel junction between the p-type tunnel junction layer and the n-type tunnel junction layer. The p-type tunnel junction layer comprises a layer of a p-type first semiconductor material that includes gallium and arsenic. The n-type tunnel junction layer comprises a layer of an n-type second semiconductor material that includes indium, gallium and phosphorus.

In another aspect, the invention provides a surface-emitting laser that comprises opposed semiconductor reflectors of the same conductivity type that define an optical cavity. The surface-emitting laser additionally comprises an active region and a tunnel junction structure located in the optical cavity. The active region comprises an n-type spacing layer and a p-type spacing layer. The tunnel junction structure comprises a p-type tunnel junction layer adjacent the p-type spacing layer, an n-type tunnel junction layer and a tunnel junction between the p-type tunnel junction layer and the n-type tunnel junction layer. The p-type tunnel junction layer comprises a layer of a p-type first semiconductor material that includes gallium and arsenic. The n-type tunnel junction layer comprises a layer of an n-type second semiconductor material that includes indium, gallium and phosphorus.

By forming at least part of the n-type tunnel junction layer of an n-type semiconductor material that comprises indium, gallium and phosphorus, the n-type tunnel junction layer can be more heavily doped than a conventional n-type tunnel junction layer formed of n-type gallium arsenide. For example, in n-type semiconductor materials grown by metal-organic chemical vapor deposition (MOCVD) using silicon as the dopant, a dopant concentration as high as $2 \times 10^{19}$ cm⁻³ can currently be obtained in InGaP, whereas the highest donor dopant concentration achievable in GaAs is currently about $3 \times 10^{18}$ cm⁻³. The higher dopant concentration reduces the width of the depletion region at the tunnel junction and increases the electrostatic field across the tunnel junction, so that the reverse bias at which tunneling occurs is reduced.

Each of the tunnel junction layers may additionally comprise a layer of another semiconductor material juxtaposed with the other of the tunnel junction layers to further reduce the reverse bias at which tunneling occurs.

DETAILED DESCRIPTION OF THE INVENTION

Figure 1:
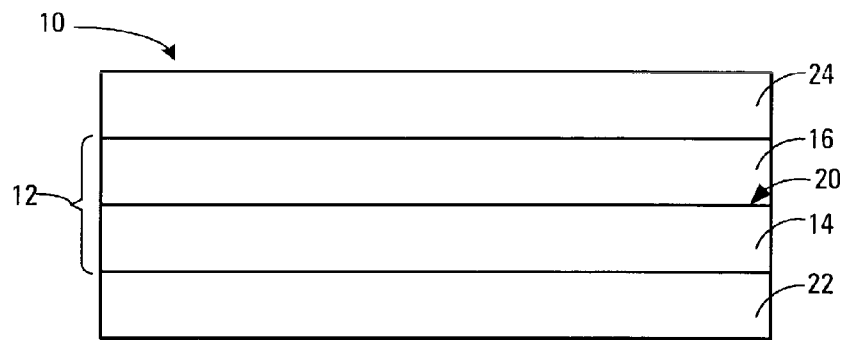
FIG. 1 is a side view showing an example of a semiconductor device incorporating a tunnel junction structure.
Figure 2A:
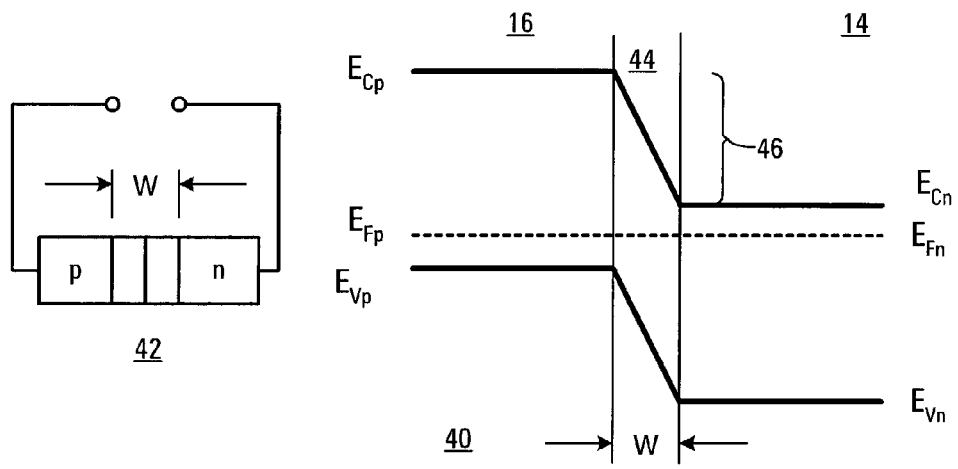
FIG. 2A includes a schematic energy diagram and an electrical circuit model showing some of the characteristics of the tunnel junction structure shown in FIG. 1 with no bias applied.
Figure 2B:
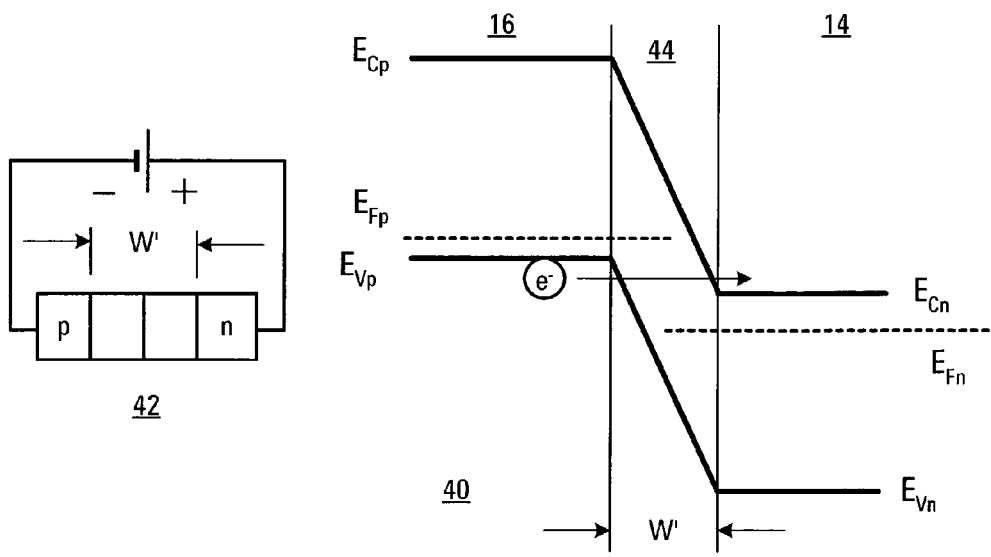
FIG. 2B includes a schematic energy diagram and an electrical circuit model showing some of the characteristics of the tunnel junction structure shown in FIG. 1 under reverse bias.
Figure 3A:
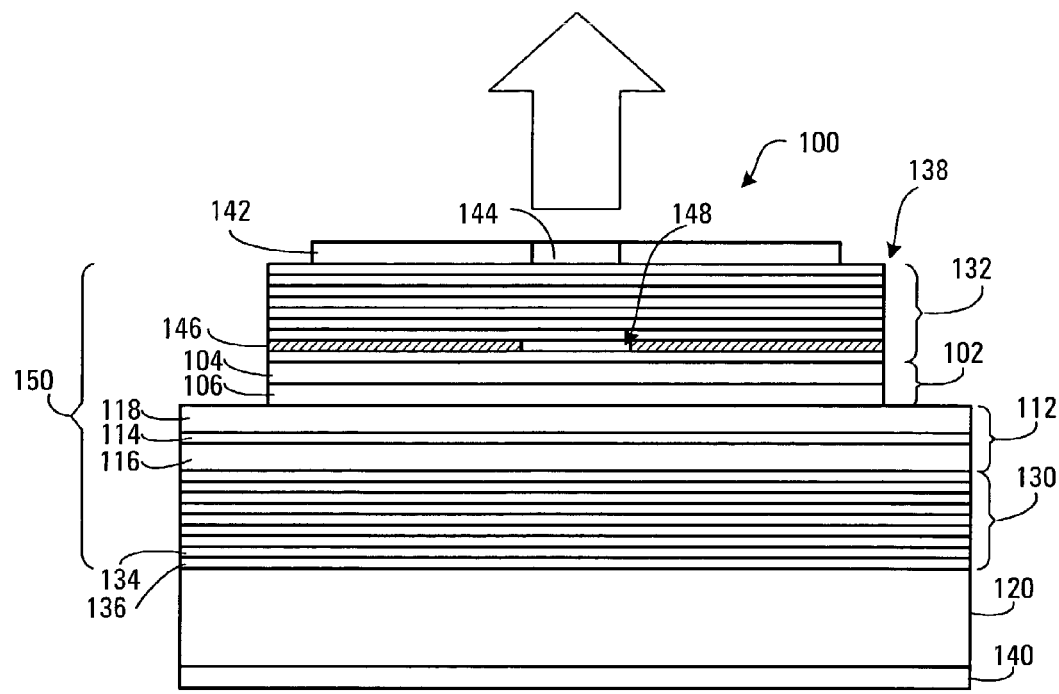
FIG. 3A is a side view showing a first embodiment of a VCSEL as an example of a light-emitting device in accordance with the invention.

FIG. 3A shows a first embodiment of a VCSEL 100 as an example of a light-emitting device in accordance with the invention. In response to a drive current passed between electrodes that form part of the VCSEL, VCSEL 100 generates coherent light at a desired emission wavelength. VCSEL 100 is composed of a substrate-side distributed Bragg reflector (DBR) 130, an active region 112, a tunnel junction structure 102 and a remote-side DBR 132, epitaxially grown, in order, on a substrate 120. Substrate 120 is part of a wafer of single-crystal gallium arsenide.

Each of DBRs 130 and 132 is composed of multiple layer pairs. Each layer pair is composed of two layers of materials that differ in refractive index. The materials of the layers are optically transparent at the desired emission wavelength. FIG. 3A shows exemplary layer 134 of a higher refractive index material and exemplary layer 136 of a lower refractive index material that together constitute an exemplary layer pair of substrate-side DBR 130. In addition to the layer pairs, each of the DBRs is composed of an additional layer of the lower refractive index material. Each layer has a thickness equal to one-quarter of the desired emission wavelength in the material of the layer, i.e., $t_b = \lambda/4n_b$, where $t_b$ is the thickness of the layer, $\lambda$ is the desired emission wavelength in vacuo and $n_b$ is the refractive index of the material of the layer.

In the example shown, both DBR 130 and DBR 132 are fabricated of doped semiconductor materials and are therefore electrically conductive. The lower refractive index semiconductor material of layer 136 is aluminum gallium arsenide and the higher refractive index semiconductor material of layer 134 is gallium arsenide. Both semiconductor layers are doped with a donor impurity, e.g., silicon. The number of layer pairs shown in FIG. 3A is substantially reduced to simplify the drawing. Substrate-side DBR 130 and remote-side DBR 132 are each composed of a sufficient number of layer pairs to provide a reflectivity of greater than about 99% and about 95%, respectively, at the desired emission wavelength.

Active region 112 is composed of quantum-well structure 114 sandwiched between substrate-side spacing layer 116 and remote-side spacing layer 118. The quantum-well structure is composed of N quantum-well layers (not shown) interleaved with N+1 barrier layers (not shown), where N is an integer greater than or equal to unity. The quantum well layers and the barrier layers are layers semiconductor materials that differ in band gap energy. The semiconductor material of the quantum well layers has a lower band gap energy than that of the barrier layers. No dopants are added to the materials of the quantum well structure when the layers constituting the quantum well structure are grown. The outermost barrier layers are typically thicker than the barrier layers interposed between the quantum well layers. Such outermost barrier layers are sometimes referred to in the art as buffer layers.

The band gap energy of the bulk semiconductor material of the quantum well layers determines the emission wavelength of VCSEL 100. The photon energy of the desired emission wavelength is slightly higher than the band gap energy of the bulk semiconductor material of the quantum well layers. Thus, the semiconductor materials of the quantum well structure depend on the desired emission layer.

In the example shown, substrate-side spacing layer 116 and the remote-side spacing layer 118 are layers of aluminum gallium arsenide (AlGaAs) with an aluminum fraction in the range from about 0.2 to about 0.8, i.e., ~0.2≦x≦~0.8 in $Al_xGa_{1-x}As$. A typical value of x is about 0.4. The spacing layers are doped to have opposite conductivity types: substrate-side spacing layer 116 is doped n-type and remote-side spacing layer 118 is doped p-type.

Spacing layers 116 and 118 constitute most of the thickness of active region 112. The active region has a thickness corresponding to M times the desired emission wavelength in the materials of the active region, i.e., $t_a = M\lambda/n_a$, where $t_a$ is the thickness of the active region, M is an integer greater than or equal to unity, λ is the desired emission wavelength in vacuo and $n_\alpha$ is the effective refractive index of the materials constituting the active region.

Substrate-side DBR 130 and remote-side DBR 132 collectively form an optical cavity 150 that is resonant at the desired output wavelength of VCSEL 100. Active region 112 and tunnel junction structure 102 are located in the optical cavity.

Light-emitting devices in accordance with the invention include a tunnel junction structure located adjacent the p-type spacing layer. In VCSEL 100, a tunnel junction structure 102 is located between remote-side p-type spacing layer 118 and remote-side DBR 132. This enables the semiconductor materials of both DBRs 130 and 132 to have the same conductivity type as one another, i.e., n-type, so that both DBRs have excellent optical and electrical characteristics.

Tunnel junction structure 102 is composed of p-type tunnel junction layer 106 located adjacent p-type spacing layer 118 and n-type tunnel junction layer 104 located adjacent remote-side DBR 132. P-type tunnel junction layer 106 comprises a layer of a p-type semiconductor material that includes gallium and arsenic. N-type tunnel junction layer 104 comprises a layer of an n-type semiconductor material that comprises indium, gallium and phosphorus. As will be described in more detail below, both tunnel junction layers are heavily doped and are preferably degenerately doped.

A layer structure from which, typically, hundreds of VCSELs identical to VCSEL 100 can be made is fabricated by epitaxially depositing layers corresponding to substrate-side DBR 130, active region 112, tunnel junction structure 102 and remote-side DBR 132 on a wafer of GaAs. Part of the layers corresponding to remote-side DBR 132 and part of tunnel junction structure 102 is etched away to form a mesa 138 that defines the location of each of the VCSELs formed in the layer structure. A current confinement structure is then formed in each mesa. For example, ions may be selectively implanted into the mesa to decrease the conductivity of the mesa in all but a small, substantially central, conductive region. The conductivity of the mesa remains substantially unchanged in the conductive region.

In the example shown, however, the current-confinement structure is formed by exploiting the dependence of the oxidation rate of AlGaAs on the fraction of aluminum in the material. When layers of the layer structure corresponding to remote-side DBR 132 are grown, at least one of the layers of AlGaAs is grown with an aluminum fraction substantially higher than that of the remaining layers of AlGaAs. For example, the high-aluminum fraction layer may have an aluminum fraction greater than about 0.9 when the remaining layers of AlGaAs have an aluminum fraction in the range from about 0.75 to about 0.85. An exemplary high-aluminum fraction AlGaAs layer is shown at 146. Aft formed, the layer structure is heated in an oxidizing atmosphere, such as an atmosphere with a high water vapor content. The oxidizing atmosphere oxidizes the exposed areas of all the layers of AlGaAs, the oxidation progressing radially inwards from the side of the mesa. However, oxidation progresses substantially faster in the high-aluminum fraction AlGaAs layer 146 than in the remaining AlGaAs layers. At the end of the oxidation process, almost all the high-aluminum fraction AlGaAs layer is oxidized to form a wide annular region of aluminum oxide surrounding a conductive region 148. Aluminum oxide has a much lower electrical conductivity than doped AlGaAs. The high-aluminum fraction AlGaAs remains unoxidized in conductive region 148 so that the optical and electrical properties of the conductive region remain substantially unchanged. The remaining AlGaAs layers are oxidized only in a narrow annular region at their peripheries.

The area of the conductive region, e.g., conductive region 148, defined by ion implantation, oxidation or otherwise, is small compared with that of the mesa 138. During operation of the VCSEL 100, the laser current is confined to the conductive region, where it achieves a very high current density. The laser current enters active region 112 from the conductive region. Current spreading is relatively small so that the current density is also very high in the active region. The very high current density lowers the threshold current of the VCSEL. In an alternative embodiment, the oxide current confinement structure just described is located between tunnel junction structure 102 and active region 112. In another alternative, tunnel junction structure 102 is structured to provide current confinement.

A substrate-side contact layer 140, composed of at least one layer of metal, is deposited on the surface of the wafer remote from the surface on which the layers of semiconductor material are epitaxially grown. A remote-side contact layer 142 is deposited on the exposed surface of the remote-side DBR 132 of each VCSEL and is patterned to define a light exit port 144. The light exit port is radially aligned with conductive region 148. The remote-side contact layer is composed of at least one layer of metal, and may additionally include at least one layer of n-type semiconductor material having a high dopant concentration to reduce the contact resistance between the metal layer and remote-side DBR 132. The layer structure is then divided into the individual VCSELs by a conventional singulation process.

Processes suitable for performing the fabrication operations described above are known in the art and will therefore not be described here. In an example, the layer structure referred to above is fabricated using metal-organic chemical vapor deposition (MOCVD). Other suitable processes are known in the art.

Figure 3B:
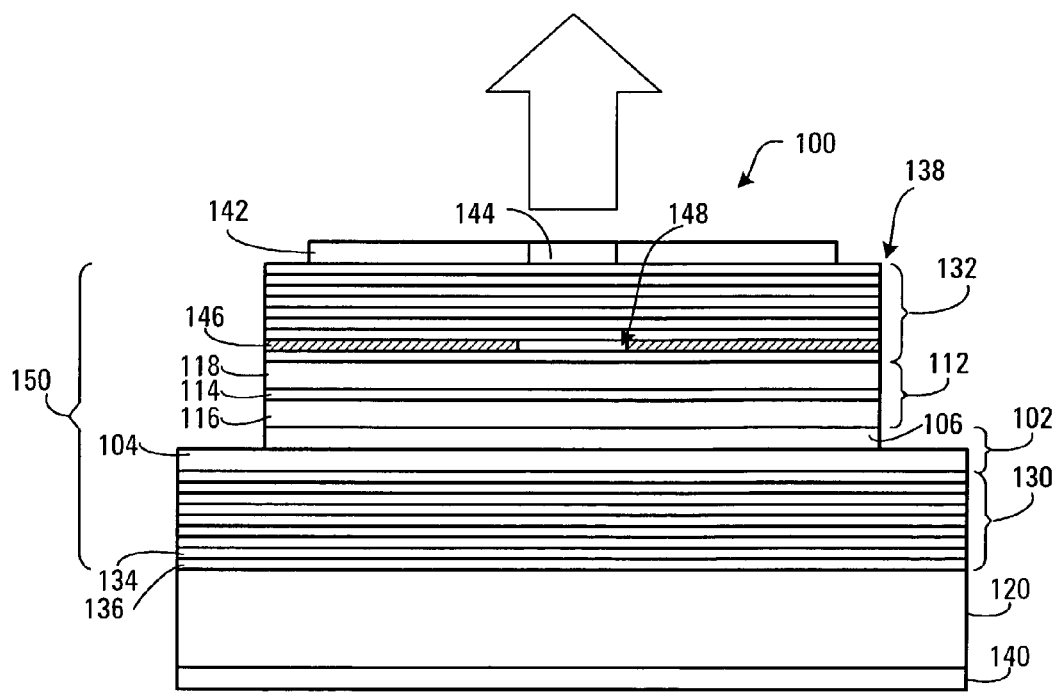
FIG. 3B is a side view showing a second embodiment of a VCSEL as another example of a light-emitting device in accordance with the invention.

FIG. 3B shows another embodiment 160 of a VCSEL as an example of a light-emitting device in accordance with the invention. Elements of VCSEL 160 that correspond to elements of VCSEL 100 described above with reference to FIG. 3A are indicated using the same reference numerals and will not be described in detail again. In VCSEL 160, substrate-side spacing layer 116 is doped p-type and remote-side spacing layer 118 is doped n-type. Tunnel junction structure 102 is located between substrate-side spacing layer 116 and substrate-side DBR 130 with p-type tunnel junction layer 106 in contact with substrate-side spacing layer 116 and n-type tunnel junction layer 104 in contact with substrate-side DBR 130.

Although VCSELs 100 and 160 incorporating tunnel junction structure 102 are shown in FIGS. 3A and 3B as top-emitting devices that emit light through aperture 144 in remote-side electrode 142, the VCSELs may alternatively be configured as bottom-emitting devices that emit light through an aperture (not shown) in substrate 120 and in contact 140.

In accordance with the invention, tunnel junction structure 102 suitable for fabrication on a substrate of GaAs is composed of n-type tunnel junction layer 104, p-type tunnel junction layer 106 and a tunnel junction between the tunnel junction layers. N-type tunnel junction layer 104 includes a layer of an n-type semiconductor material that comprises indium, gallium and phosphorus. P-type tunnel junction layer 106 includes a layer of a p-type semiconductor material that comprises gallium and arsenic. By forming at least part of the n-type tunnel junction layer of a semiconductor material that comprises indium, gallium and phosphorus, the n-type tunnel junction layer can be more heavily doped than a conventional n-type tunnel junction layer formed of gallium arsenide. For example, a donor (n-type) dopant concentration as high as $2 \times 10^{19}$ atoms $cm^{-3}$ can currently be obtained in InGaP, whereas the highest donor dopant concentration achievable in GaAs is currently about $3 \times 10^{18}$ $cm^{-3}$. The higher dopant concentration reduces the width of the depletion region at the tunnel junction and increases the electrostatic field across the tunnel junction, so that the reverse bias at which tunneling occurs is reduced.

As noted above, n-type tunnel junction layer 104 includes a layer of an n-type semiconductor material that includes indium, gallium and phosphorus. In an embodiment, this semiconductor material is indium gallium phosphide (InGaP). Alternative semiconductor materials include aluminum indium gallium phosphide (AlInGaP), indium gallium arsenide phosphide (InGaAsP) and aluminum indium gallium arsenide phosphide (AlInGaAsP). The arsenic-containing compounds have a relatively low arsenic fraction, typically less than 10%.

Also as noted above, p-type tunnel junction layer 106 includes a layer of a p-type semiconductor material that includes gallium and arsenic. In an embodiment, the semiconductor material of p-type tunnel junction layer 106 is gallium arsenide (GaAs).

Figure 4A:
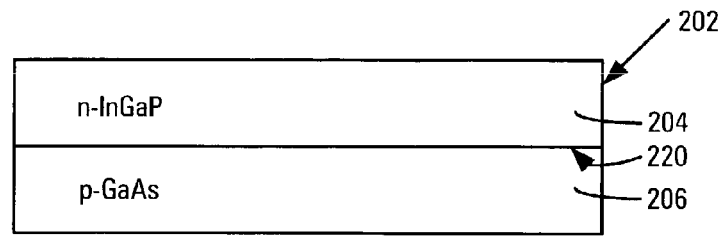
FIG. 4A is a side view showing a first exemplary embodiment of a tunnel junction structure suitable for incorporation in a light-emitting device in accordance with the invention.

FIG. 4A shows a first exemplary embodiment 202 of a tunnel junction structure that can be incorporated as tunnel junction structure 102 in VCSEL 100 or in VCSEL 160 shown in FIGS. 3A and 3B, respectively, or in other light-emitting devices fabricated on GaAs substrates. In this embodiment, tunnel junction structure 202 is composed of an n-type tunnel junction layer 204 and a p-type tunnel junction layer 206 that collectively define a tunnel junction 220. The semiconductor material of p-type tunnel junction layer 206 is GaAs. The semiconductor material of n-type tunnel junction layer 204 is InGaP. In one embodiment, the semiconductor material of n-type tunnel junction layer 204 is $In_xGa_{1-x}P$ in which the In fraction x is 0.51. $In_{0.51}Ga_{0.49}P$ is lattice-matched to GaAs. In other embodiments, the semiconductor material of n-type tunnel junction layer 204 may additionally include fractions of either or both of aluminum and arsenic.

Figure 4B:
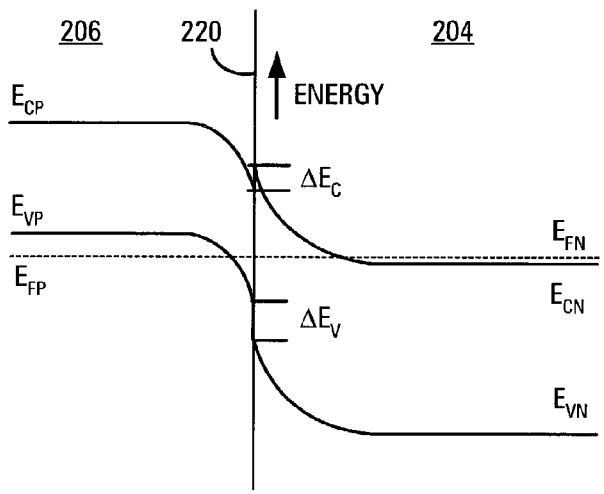
FIG. 4B is a schematic energy diagram showing some of the characteristics of the tunnel junction structure shown in FIG. 4A with no bias applied.

FIG. 4B is a band energy diagram showing the band alignment of tunnel junction structure 202 with no applied bias. The difference in bandgap energy between InGaP and GaAs is about 0.5 eV. Photoluminescence measurements show that the conduction band discontinuity at the tunnel junction 220 between n-type tunnel junction layer 204 of InGaP and p-type tunnel junction layer 206 of GaAs is about 0.15 eV. Thus, the valence band discontinuity is about 0.35 eV. This means that the height of the tunneling barrier is slightly greater than that of in tunnel junction structure in which both layers are layers of GaAs. However, the reduction in tunneling resulting from the greater tunneling barrier height is more than offset by the increase in tunneling resulting from the higher dopant concentration attainable in the InGaP of the n-type tunnel junction layer. The higher dopant concentration reduces the width of the depletion region and increases the electrostatic field across the tunnel junction, so that the reverse bias at which tunneling occurs is reduced.

Figure 4C:
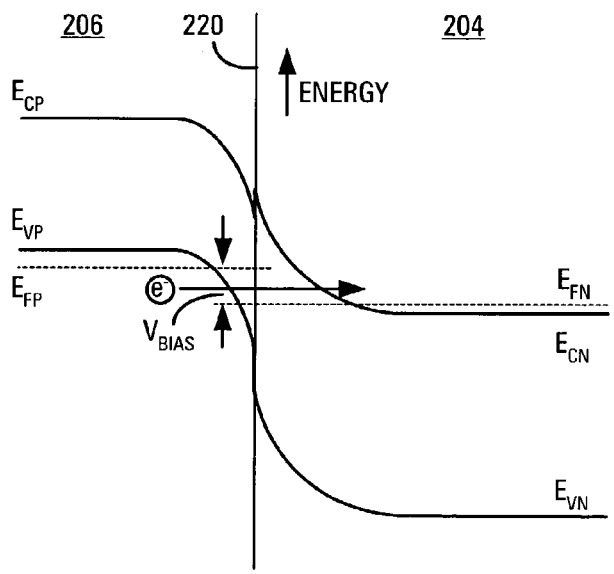
FIG. 4C is a schematic energy diagram showing some of the characteristics of the tunnel junction structure shown in FIG. 4A with under reverse bias.

A reverse bias $V_{BIAS}$ applied to tunnel junction structure 202 increases the energy level $E_{VP}$ of the valance band of the semiconductor material of p-type tunnel junction layer 206. This allows electrons to tunnel through the tunneling barrier into vacant sites in the conduction band of n-type tunnel junction layer 204. This is illustrated in FIG. 4C, which is a band energy diagram showing the band alignment of tunnel junction structure 202 under reverse bias.

As noted above, the tunnel junction layers constituting tunnel junction structure 202 are epitaxially grown using, for example, metal-organic chemical vapor deposition (MOCVD). The semiconductor material of p-type tunnel junction layer 206 is GaAs doped with carbon and grown at a growth temperature in the range from 500° C. to 600° C. Carbon tetrabromide ($CBr_4$) is a suitable precursor for the carbon dopant. Acceptor dopant concentrations as high as $1.0 \times 10^{20}$ $cm^{-3}$ have been achieved with a flow rate of the carbon precursor below that at which etching becomes a concern due to the high incorporation efficiency of carbon in GaAs. An oxygen level as low as $10^{16}$ $cm^{-3}$ can be obtained.

The semiconductor material of n-type tunnel junction layer 204 is InGaP doped with silicon and grown at a growth temperature of about 650° C. Silane ($SiH_4$) or disilane ($Si_2H_6$) are suitable precursors for the silicon dopant. Donor dopant concentrations as high as $2 \times 10^{19}$ $cm^{-3}$ can be achieved, compared with about $1 \times 10^{18}$ in Si-doped GaAs. As noted above, the high dopant concentration attainable on both sides of tunnel junction 220 means that tunnel junction structure 202 has a narrow depletion region and, hence, a low voltage drop at high tunneling currents. An exemplary embodiment had a voltage drop of 0.4 V at a current density of 10 kA $cm^{-3}$.

The narrow depletion region resulting from the high dopant concentrations attainable in tunnel junction layers 204 and 206 means that the tunnel junction layers can be relatively thin and yet accommodate the entire depletion region. Each of the tunnel junction layers has a thickness in the range from about 5 nm to about 30 nm. In embodiments, the thickness of each tunnel junction layer was in the range from about 10 nm to about 30 nm. In one embodiment, the thickness was about 15 nm. As noted above, InGaP with an indium fraction of 0.51 is lattice matched to GaAs. However, the small thickness of the tunnel junction layers enables n-type tunnel junction layer 204 to have an indium fraction in the range from about 0.4 to about 0.6 without compromising the crystalline quality of tunnel junction structure 202.

The bandgap of InGaP with an indium fraction of 0.51 is about 1.9 eV. Therefore, light absorption is not a concern when $In_{0.51}Ga_{0.49}P$ is used as the semiconductor material of n-type tunnel junction layer 204 in a VCSEL that generates light in a wavelength range of 1.3 μm to 1.55 μm.

Figure 5A:
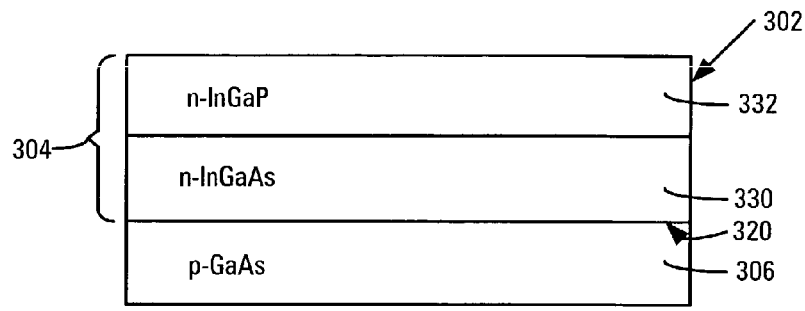
FIG. 5A is a side view showing a second exemplary embodiment of a tunnel junction structure suitable for incorporation in a light-emitting device in accordance with the invention.

FIG. 5A shows a second exemplary embodiment 302 of a tunnel junction structure in accordance with the invention. Tunnel junction 302 can be incorporated as tunnel junction structure 102 in VCSEL 100 shown in FIG. 3A, in VCSEL 160 shown in FIG. 3B or in other light-emitting devices fabricated on GaAs substrates. Tunnel junction structure 302 is composed of an n-type tunnel junction layer 304 and a p-type tunnel junction layer 306 that collectively define a tunnel junction 320. N-type tunnel junction layer 304 is composed of a layer 330 of an n-type semiconductor material that comprises indium, gallium and arsenic sandwiched between p-type tunnel junction layer 306 and a layer 332 of an n-type semiconductor material that comprises indium, gallium and phosphorus. P-type tunnel junction layer 306 is a layer of a p-type semiconductor material that comprises gallium and arsenic.

In an exemplary embodiment, the semiconductor materials of layers 330 and 332 of n-type tunnel junction layer 304 are n-type indium gallium arsenide and n-type indium gallium phosphide, respectively, and the semiconductor material of p-type tunnel junction layer 306 is p-type gallium arsenide. The InGaP of layer 332 of n-type tunnel junction layer 304 is similar to the InGaP of n-type tunnel junction layer 204 described above with reference to FIG. 4A. The GaAs of p-type tunnel junction layer 306 is similar to the GaAs of p-type tunnel junction layer 206 described above with reference to FIG. 4A.

Indium gallium arsenide $In_yGa_{1-y}As$ in which the indium fraction y is relatively low, e.g., in the range between about 10% and about 30%, and typically about 20%, has a lower bandgap energy and a higher incorporation efficiency of a silicon dopant than GaAs. In layer 330, the InGaAs is doped with silicon with a dopant concentration in the range from about $5 \times 10^{18}$ cm$^{-3}$ to about $5 \times 10^{19}$ cm$^{-3}$. The lower bandgap energy and the higher dopant concentration attainable both help reduce the threshold voltage at which tunneling occurs and the voltage drop across tunnel junction 320 for a given tunneling current.

The InGaAs of layer 330 juxtaposed with the GaAs of p-type tunnel junction layer 306 is compressively strained due to a lattice mismatch. However, the In fraction in the InGaP of layer 332 also juxtaposed with layer 330 can be reduced from the value that provides lattice matching with GaAs to reduce the lattice constant of the InGaP of layer 332. This subjects layer 332 to tensile strain that balances the compressive strain of the InGaAs layer and provides an overall lattice match to the GaAs of p-type tunnel junction layer 306. The high dopant concentrations attainable in layers 330 and 332 enables the thickness of these layers to be made less than the critical thickness so that the layers can have a good crystalline quality. In this embodiment, layers 306, 330 and 332 each have a thickness in the range from about 5 nm to about 30 nm.

Figure 5B:
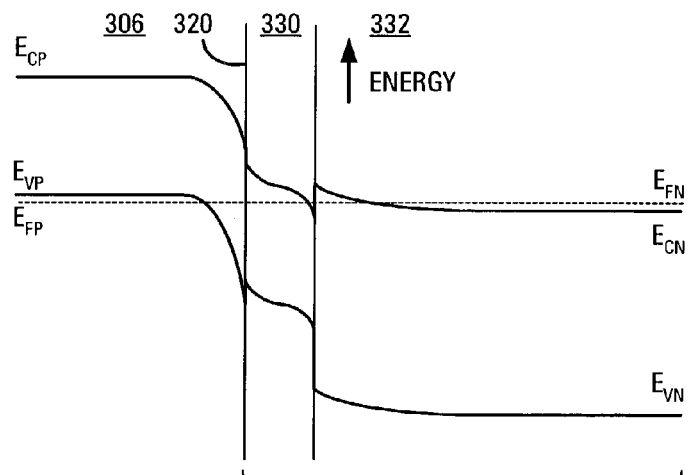
FIG. 5B is a schematic energy diagram showing some of the characteristics of the tunnel junction structure shown in FIG. 5A with no bias applied.
Figure 5C:
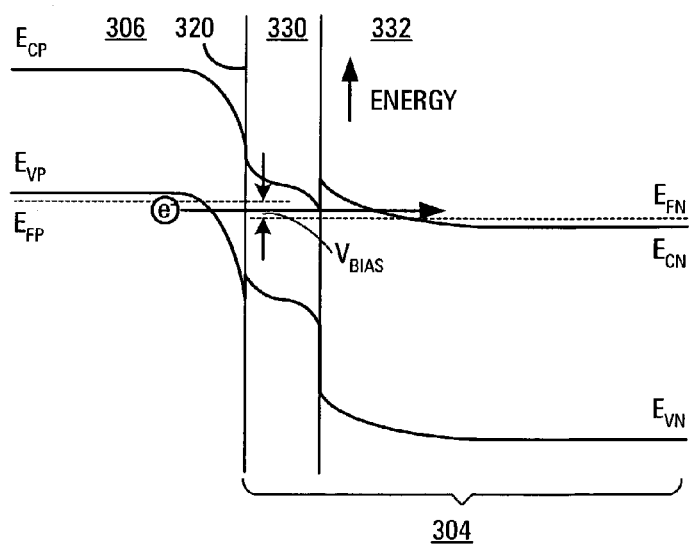
FIG. 5C is a schematic energy diagram showing some of the characteristics of the tunnel junction structure shown in FIG. 5A with under reverse bias.

FIGS. 5B and 5C are band energy diagrams showing the band alignment of tunnel junction structure 302 under unbiased and reverse-bias conditions, respectively. Tunnel junction structure 302 is composed of multiple layers of semiconductor material that are relatively thin and are subject to strain. As a result, the tunnel junction structure has a different band lineup from that which would result if all the layers were unstrained. The strain of InGaP layer 332 affects the band lineup between InGaAs layer 330 and GaAs layer 306. In particular, compressively-strained InGaAs layer 330 juxtaposed with tensile-strained InGaP layer 332 has a more favorable band lineup than that of their unstrained counterparts. The conduction band discontinuity between InGaAs layer 330 and GaAs p-type tunnel junction layer 306 is increased as the compressive strain of InGaAs layer 330 is increased. Moreover, the conduction band discontinuity between the InGaP of layer 332 and the GaAs of p-type tunnel junction layer 306 is reduced by subjecting the InGaP of layer 332 to tensile strain.

Figure 6A:
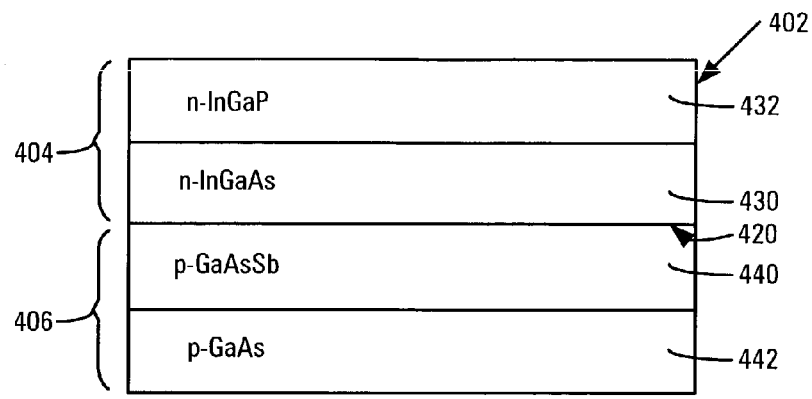
FIG. 6A is a side view showing a third exemplary embodiment of a tunnel junction structure suitable for incorporation in a light-emitting device in accordance with the invention.

FIG. 6A shows a third exemplary embodiment 402 of tunnel junction structure in accordance with the invention. Tunnel junction structure 402 can be incorporated as tunnel junction structure 102 in VCSEL 100 shown in FIG. 3A, in VCSEL 160 shown in FIG. 3B or in other light-emitting devices fabricated on GaAs substrates. Tunnel junction structure 402 is composed of an n-type tunnel junction layer 404 and a p-type tunnel junction layer 406 that collectively define a tunnel junction 420. N-type tunnel junction layer 404 is composed of a layer 430 of an n-type semiconductor material that comprises indium, gallium and arsenic sandwiched between p-type tunnel junction layer 406 and a layer 432 of an n-type semiconductor material that comprises indium, gallium and phosphorus. P-type tunnel junction layer 406 is composed of a layer 440 of a p-type semiconductor material that comprises gallium, arsenic and antimony sandwiched between n-type tunnel junction layer 404 and a layer 442 of a p-type semiconductor material that comprises gallium and arsenic.

In an exemplary embodiment, the semiconductor materials of layers 430 and 432 of n-type tunnel junction layer 404 are n-type indium gallium arsenide and n-type indium gallium phosphide, respectively, and the semiconductor materials of layers 430 and 432 of p-type tunnel junction layer 406 are p-type gallium arsenide antimonide and p-type gallium arsenide, respectively. The InGaAs of layer 430 of n-type tunnel junction layer 404 is similar to the InGaAs of layer 330 of n-type tunnel junction layer 304 described above with reference to FIG. 5A. The InGaP of layer 432 of n-type tunnel junction layer 404 is similar to the InGaP of n-type tunnel junction layer 204 described above with reference to FIG. 4A. The GaAs of layer 442 of p-type tunnel junction layer 406 is similar to the GaAs of p-type tunnel junction layer 206 described above with reference to FIG. 4A.

In layer 440, the gallium arsenide antimonide $GaAs_{1-z}Sb_z$ has an antimony fraction z in the range from about 0.2 to about 0.4. In an embodiment, the antimony fraction was 0.3. The gallium arsenide antimonide is doped with carbon at a dopant concentration in the range from about $2 \times 10^{19}$ cm$^{-3}$ to about $1 \times 10^{20}$ cm$^{-3}$.

As noted above, the tunneling probability in a tunnel junction depends exponentially on the height of the tunneling barrier between the tunnel junction layers. The height of the tunneling barrier depends in part on the band gap energies of the semiconductor materials of the two layers juxtaposed to define the tunnel junction. In tunnel junction structure 402, the height of the tunneling barrier is reduced by forming juxtaposed portions of the tunnel junction layers from semiconductor materials having low bandgap energies, i.e., n-InGaAs and p-GaAsSb.

Light absorption can be a problem when the semiconductor materials of the tunnel junction layers have respective bandgap energies less than the photon energy of the desired emission wavelength. In VCSEL 100 shown in FIG. 3A or in VCSEL 160 shown in FIG. 3B, light absorption by the low bandgap energy semiconductor materials of tunnel junction structure 402 is reduced by locating layer 440, the layer fabricated of the semiconductor material with the lowest bandgap energy, at a null of the optical standing wave in optical cavity 150 defined by DBRs 130 and 132. Layer 440 may alternatively be located sufficiently close to such a null that light absorption by this layer is below an acceptable level. In VCSEL 100 shown in FIG. 3A, layer 440 is located at a null of the optical standing wave in the optical cavity by increasing the thickness of layer 432 and decreasing the thickness of remote-side spacing layer 118 to increase the separation of layer 440 from DBR 132. In VCSEL 160 shown in FIG. 3B, layer 440 is located at a null of the optical standing wave in the optical cavity by increasing the thickness of layer 432 and decreasing the thickness of substrate-side spacing layer 116 to increase the separation of layer 440 from DBR 130. The optical standing wave typically has maxima at the quantum well structure of active region 112 and at the layer of each of DBRs 130 and 132 closest to the active region.

As noted above, the layers 430, 432, 440 and 442 constituting tunnel junction structure 400 are degenerately doped, which allows these layers to be made relatively thin. The layers typically range in thickness from about 5 nm to about 30 nm and are typically about 15 nm thick. The InGaP of layer 432 is formulated to provide strain compensation. InGaP with an In fraction of about 0.5 is substantially unstrained: to provide tensile strain, an In fraction as low as 0.25 can be used. Layer 440 of strained GaAsSb sandwiched between the GaAs of layer 442 and the InGaAs of layer 430 further increases tunneling.

Figure 6B:
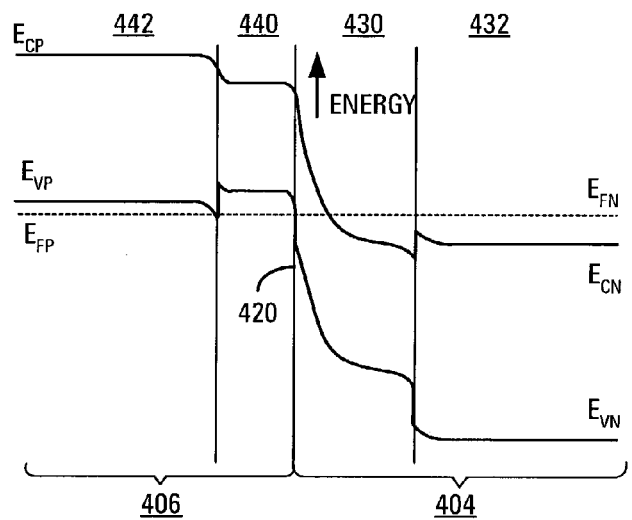
FIG. 6B is a schematic energy diagram showing some of the characteristics of the tunnel junction structure shown in FIG. 6A with no bias applied.
Figure 6C:
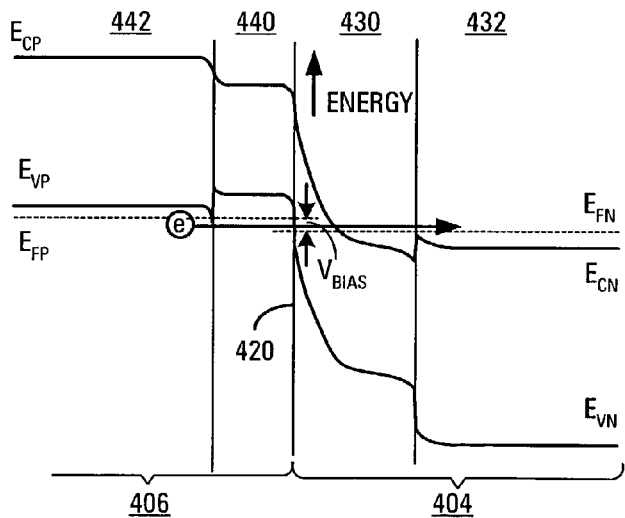
FIG. 6C is a schematic energy diagram showing some of the characteristics of the tunnel junction structure shown in FIG. 6A with under reverse bias.

FIGS. 6B and 6C are band energy diagrams showing the band alignment of tunnel junction structure 402 under unbiased and reverse-bias conditions, respectively. FIG. 6B shows the low band gap energy of GaAsSb. FIG. 6B additionally shows how incorporating GaAsSb layer 440 between InGaAs layer 430 and GaAs layer 432 significantly reduces the height of the tunneling barrier. The layer 440 of a semiconductor material having a small band gap energy has a favorable band lineup with the InGaAs of layer 430 that makes the voltage drop across tunnel junction 420 lower than in the tunnel junction structures shown in FIGS. 4A and 5A.

The invention has been described above with reference to examples in which the substrate is part of a wafer of gallium arsenide. Alternatively, the substrate may be a part of a wafer of another material on which a layer of GaAs has been deposited. The layers described above as being deposited on the substrate are deposited on the layer of GaAs. The term "a substrate comprising gallium arsenide" will be understood to encompass both types of substrate just described. The invention has also been described above with reference to examples in which tunnel junction structures in accordance with the invention are incorporated in VCSELs. Tunnel junction structures in accordance with the invention may alternatively be incorporated into other types of light-emitting devices, for example, edge-emitting lasers, semiconductor optical amplifiers and light-emitting diodes.

This disclosure describes the invention in detail using illustrative embodiments. However, it is to be understood that the invention defined by the appended claims is not limited to the precise embodiments described.

We claim:

1. A light-emitting device, comprising:
a substrate comprising gallium arsenide;
an active region comprising an n-type spacing layer and a p-type spacing layer; and
a tunnel junction structure comprising a p-type tunnel junction layer adjacent the p-type spacing layer, an n-type tunnel junction layer and a tunnel junction between the p-type tunnel junction layer and the n-type tunnel junction layer, in which:
the p-type tunnel junction layer comprises a layer of a p-type first semiconductor material including gallium and arsenic; and
the n-type tunnel junction layer comprises a layer of an n-type second semiconductor material including indium, gallium and phosphorus;
wherein the second semiconductor material has an indium fraction that provides the second semiconductor material with a lattice constant that matches that of the first semiconductor material, where the first semiconductor material is gallium arsenide, and the second semiconductor material is indium gallium phosphide of which the indium gallium phosphide has an indium fraction of 0.4 to 0.6.

2. A light-emitting device, comprising:
a substrate comprising gallium arsenide;
an active region comprising an n-type spacing layer and a p-type spacing layer; and
a tunnel junction structure comprising a p-type tunnel junction layer adjacent the p-type spacing layer, an n-type tunnel function layer and a tunnel junction between the p-type tunnel junction layer and the n-type tunnel function layer, in which:
the p-type tunnel junction layer comprises a layer of a p-type first semiconductor material including gallium and arsenic; and
the n-type tunnel junction layer comprises a layer of an n-type second semiconductor material including indium, gallium and phosphorus;
wherein the second semiconductor material has an indium fraction that provides the second semiconductor material with a lattice constant that matches that of the first semiconductor material, where the first semiconductor material is gallium arsenide, and the second semiconductor material is indium gallium phosphide and the n-type tunnel junction layer additionally comprises a layer of an n-type third semiconductor material sandwiched between the layer of the second semiconductor material and the p-type tunnel junction layer, and the third semiconductor material comprises indium, gallium and arsenic.

3. The light-emitting device of claim 2, in which the second semiconductor material and the third semiconductor material have respective compositions that provide strain compensation between the layers.

4. The light-emitting device of claim 2, in which:
the first semiconductor material is gallium arsenide;
the second semiconductor material is indium gallium phosphide; and
the third semiconductor material is indium gallium arsenide.

5. The light-emitting device of claim 2, in which the p-type tunnel junction layer additionally comprises a layer of a p-type fourth semiconductor material sandwiched between the layer of the first semiconductor material and the layer of the third semiconductor material, the fourth semiconductor material comprising gallium, arsenic and antimony.

6. The light-emitting device of claim 5, in which the fourth semiconductor material and the third semiconductor material have respective compositions that provide strain compensation between the layers.

7. The light-emitting device of claim 5, in which:
the first semiconductor material is gallium arsenide;
the second semiconductor material is indium gallium phosphide
the third semiconductor material is indium gallium arsenide; and
the fourth semiconductor material is gallium arsenide antimonide.

8. A surface-emitting laser, comprising:
opposed semiconductor reflectors the same conductivity type, the reflectors defining an optical cavity; and
an active region and a tunnel junction structure located in the optical cavity, in which:
the active region comprises an n-type spacing layer and a p-type spacing layer;
the tunnel junction structure comprises a p-type tunnel junction layer adjacent the p-type spacing layer, an n-type tunnel junction layer and a tunnel junction between the p-type tunnel junction layer and the n-type tunnel junction layer;
the p-type tunnel junction layer comprises a layer of a p-type first semiconductor material including gallium and arsenic; and the n-type tunnel junction layer comprises a layer of an n-type second semiconductor material including indium, gallium and phosphorus;

wherein the second semiconductor material has an indium fraction that provides the second semiconductor material with a lattice constant that matches that of the first semiconductor material, where the first semiconductor material is gallium arsenide, and the second semiconductor material is indium gallium phosphide of which the indium gallium phosphide has an indium fraction of 0.4 to 0.6.

9. A surface-emitting laser, comprising:

opposed semiconductor reflectors if the same conductivity type, the reflectors defining an optical cavity; and an active region and a tunnel junction structure located in the optical cavity, in which:

the active region comprises an n-type spacing layer and a p-type spacing layer;

the tunnel junction structure comprises a p-type tunnel junction layer adjacent the p-type spacing layer, an n-type tunnel junction layer and a tunnel junction between the p-type tunnel junction layer and the n-type tunnel junction layer;

the p-type tunnel junction layer comprises a layer of a p-type first semiconductor material including gallium and arsenic; and the n-type tunnel junction layer comprises a layer of an n-type second semiconductor material including indium, gallium and phosohorus;

wherein the second semiconductor material has an indium fraction that provides the second semiconductor material with a lattice constant that matches that of the first semiconductor material, where the first semiconductor material is gallium arsenide, and the second semiconduct material is indium gallium phosphide and the n-type tunnel junction layer additionally comprises a layer of an n-type third semiconductor material sandwiched between the layer of the second semiconduct material and the p-type tunnel junction layer, and the third semiconductor material comprises indium, gallium and arsenic.

10. The surface-emitting laser of claim 9, in which the second semiconductor material and the third semiconductor material have respective compositions that provide strain compensation between the layers.

11. The surface-emitting laser of claim 9, in which:
the first semiconductor material is gallium arsenide;
the second semiconductor material is indium gallium phosphide; and
the third semiconductor material is indium gallium arsenide.

12. The surface-emitting laser of claim 9, in which the p-type tunnel junction layer additionally comprises a layer of a p-type fourth semiconductor material sandwiched between the layer of the first semiconductor material and the layer of the third semiconductor material, the fourth semiconductor material comprising gallium, arsenic and antimony.

13. The surface-emitting laser of claim 12, in which the fourth semiconductor material and the third semiconductor material have respective compositions that provide strain compensation between the layers.

14. The light-emitting device of claim 12, in which:
the first semiconductor material is gallium arsenide;
the second semiconductor material is indium gallium phosphide
the third semiconductor material is indium gallium arsenide; and
the fourth semiconductor material is gallium arsenide antimonide.

* * * * *